US009923460B2

(12) United States Patent
Li et al.

(10) Patent No.: US 9,923,460 B2
(45) Date of Patent: Mar. 20, 2018

(54) CIRCUITS, DEVICES AND METHODS FOR ACHIEVING SMALL DUTY CYCLES IN SWITCHING REGULATORS

(71) Applicant: SKYWORKS SOLUTIONS, INC., Woburn, MA (US)

(72) Inventors: Thomas Zoki Li, Mountain View, CA (US); Ghader Razmafrouz, Mountain View, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 87 days.

(21) Appl. No.: 14/687,826

(22) Filed: Apr. 15, 2015

(65) Prior Publication Data

US 2016/0013778 A1   Jan. 14, 2016

Related U.S. Application Data

(60) Provisional application No. 61/980,115, filed on Apr. 16, 2014.

(51) Int. Cl.
| | |
|---|---|
| *H02M 3/156* | (2006.01) |
| *H03K 7/08* | (2006.01) |
| *H03K 5/05* | (2006.01) |
| *H03K 5/156* | (2006.01) |
| *H02M 1/00* | (2006.01) |

(52) U.S. Cl.
CPC .............. *H02M 3/156* (2013.01); *H03K 5/05* (2013.01); *H03K 5/1565* (2013.01); *H03K 7/08* (2013.01); *H02M 2001/0003* (2013.01)

(58) Field of Classification Search
CPC . H03K 7/08; H03K 5/05; H02M 1/08; H02M 2001/0003; H02M 3/156
See application file for complete search history.

(56) References Cited

U.S. PATENT DOCUMENTS

| | | | |
|---|---|---|---|
| 2006/0055387 A1* | 3/2006 | Steele .................... | H02M 3/158 323/283 |
| 2010/0033261 A1* | 2/2010 | Stevenson ................ | H03K 7/08 332/109 |

* cited by examiner

*Primary Examiner* — Harry Behm
(74) *Attorney, Agent, or Firm* — Chang & Hale LLP

(57) ABSTRACT

Circuits, devices and methods for achieving small duty cycles in switching regulators. In some embodiments, a method for generating a low duty cycle output voltage can include setting a ramp signal to a first level substantially with a first edge of a clock signal, and ramping the ramp signal from the first level towards a second level such that voltage level of the ramp signal crosses a compensation level, with the ramping beginning at a time before a second edge of the clock signal. The method can further include starting an output pulse substantially with the second edge of the clock signal, and ending the output pulse substantially with an edge of a pulse-width modulation (PWM) signal that results from the ramp signal crossing the compensation level during the ramping.

20 Claims, 10 Drawing Sheets

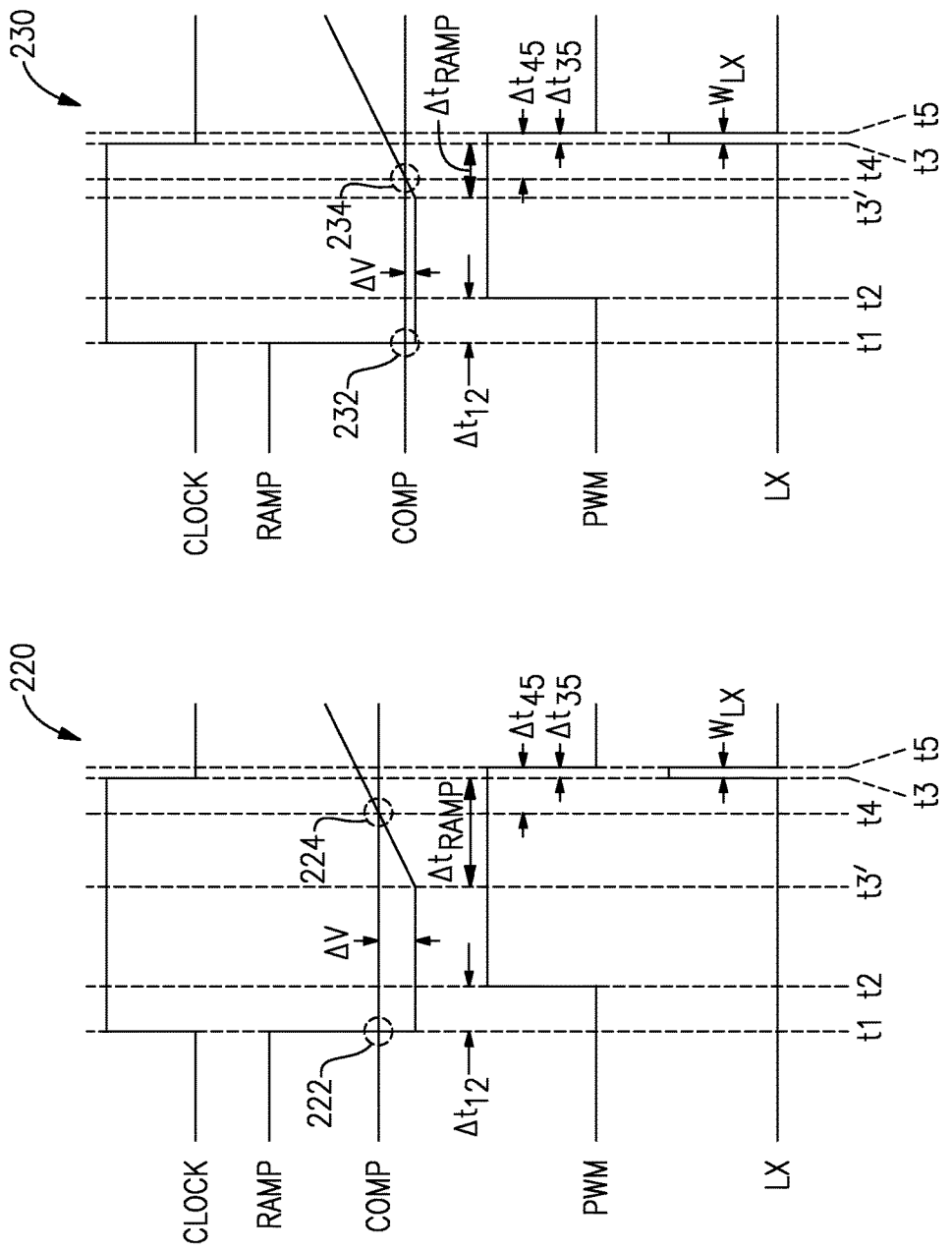

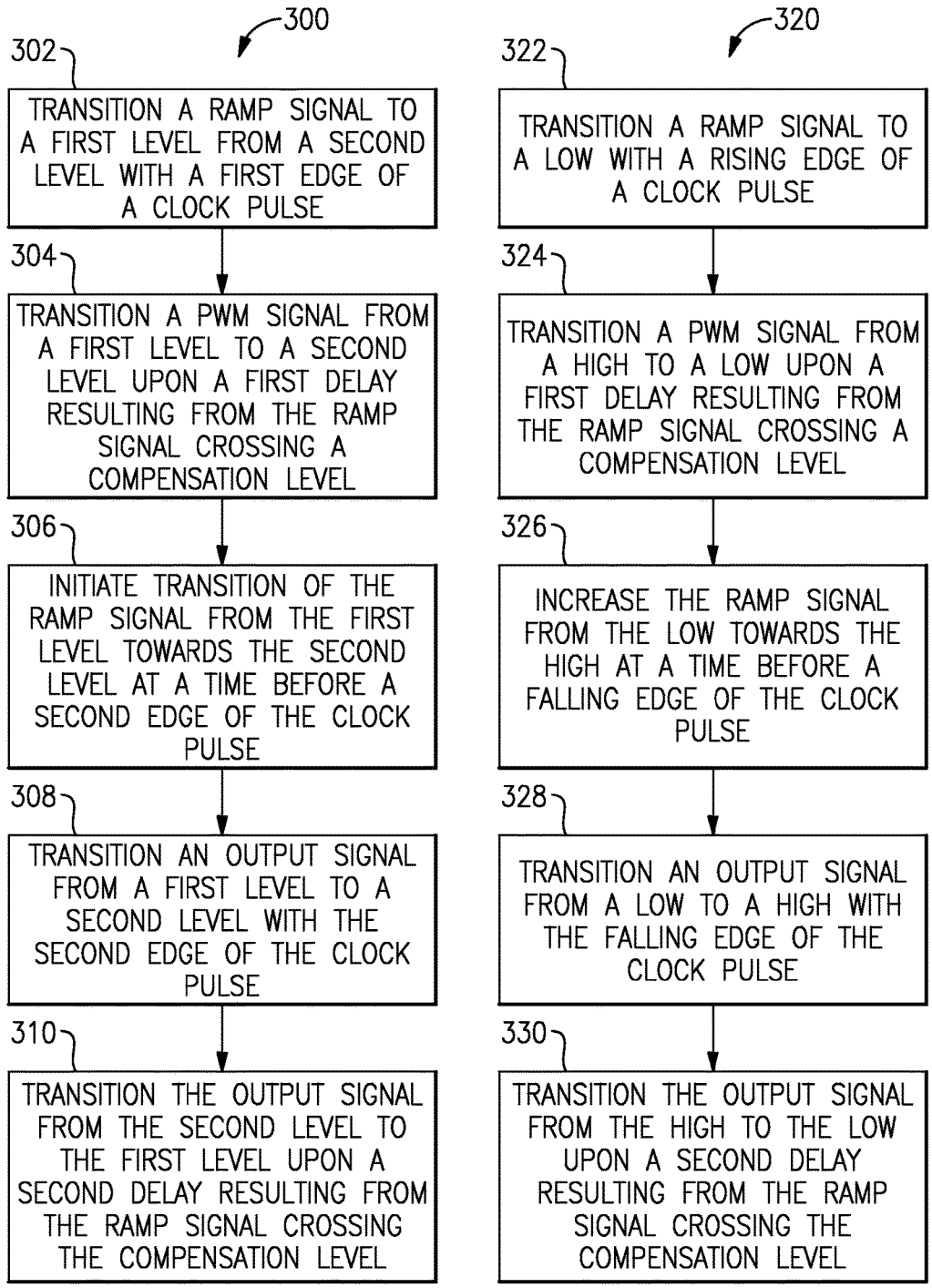

CIRCUITS, DEVICES AND METHODS FOR ACHIEVING SMALL DUTY CYCLES IN SWITCHING REGULATORS

CROSS-REFERENCE TO RELATED APPLICATION(S)

This application claims priority to U.S. Provisional Application No. 61/980,115 filed Apr. 16, 2014, entitled CIRCUITS, DEVICES AND METHODS FOR ACHIEVING SMALL DUTY CYCLES IN SWITCHING REGULATORS, the disclosure of which is hereby expressly incorporated by reference herein in its entirety.

BACKGROUND

Field

The present disclosure relates to switching regulators capable of achieving small duty cycles.

Description of the Related Art

In many electronic applications, an input voltage can be stepped up or stepped down to a desired output voltage. Generation of such an output voltage can be achieved by a switching regulator.

SUMMARY

According to some teachings, the present disclosure relates to a method for generating a low duty cycle output voltage. The method includes setting a ramp signal to a first level substantially with a first edge of a clock signal, and ramping the ramp signal from the first level towards a second level such that voltage level of the ramp signal crosses a compensation level, with the ramping beginning at a time before a second edge of the clock signal. The method further includes starting an output pulse substantially with the second edge of the clock signal, and ending the output pulse substantially with an edge of a pulse-width modulation (PWM) signal that results from the ramp signal crossing the compensation level during the ramping.

In some embodiments, the first edge and the second edge of the clock signal can be a rising edge and a falling edge, respectively. The first level of the ramp signal can include a low voltage level that is lower than the compensation level. The second level of the ramp signal can include a high voltage level that is higher than the compensation level. The ramping of the ramp signal can include a monotonic increase in the voltage level of the ramp signal. The monotonically increasing voltage level can include a triangular signal profile. The monotonically increasing voltage level can include a level-shifted profile.

In some embodiments, the edge of the PWM signal that ends the output pulse can be a falling edge of the PWM signal. The PWM signal can include a rising edge prior to its falling edge, with the rising edge of the PWM signal resulting from a crossing of the ramp signal voltage level and the compensation level when the ramp signal is set to the low voltage level with the rising edge of the clock signal. The rising edge of the PWM signal can be delayed from the crossing of the ramp signal voltage level and the compensation level when the ramp signal is set to the low voltage level. The falling edge of the PWM signal can be delayed from the crossing of the ramp signal voltage level and the compensation level during the ramping. The beginning time of the ramping can be selected such that the width of the output pulse is less than the delay between the falling edge of the PWM signal and the crossing during the ramping. The width of the output pulse can be selected to yield a low duty cycle output voltage that is less than a duty cycle output voltage associated with an output pulse having a width substantially the same as the delay between the falling edge of the PWM signal and the crossing during the ramping.

In some embodiments, the output pulse can be generated by switching on and off an input voltage. The switching on and off of the input voltage can correspond to the starting and ending of the output pulse, respectively.

In some embodiments, the method can further include providing the output pulse in a feedback loop to regulate the compensation level. The feedback loop can include a voltage divider configured to yield a reduced feedback voltage corresponding to the output pulse. The feedback loop can further include an error amplifier configured to amplify a difference between the feedback voltage and a reference voltage and yield as an output the compensation level. The error amplifier can include a compensation feedback circuit configured to allow adjustment of the compensation level.

In a number of implementations, the present disclosure relates to a method for operating a pulse-width modulation (PWM) circuit. The method includes determining whether a low duty cycle output voltage is desired, and upon determining that the low duty cycle output voltage is desired, configuring the PWM circuit to a first mode. The first mode includes setting a ramp signal to a first level substantially with a first edge of a clock signal. The first mode further includes ramping the ramp signal from the first level towards a second level such that voltage level of the ramp signal crosses a compensation level, with the ramping beginning at a time before a second edge of the clock signal. The first mode further includes starting an output pulse substantially with the second edge of the clock signal. The first mode further includes ending the output pulse substantially with an edge of a pulse-width modulation (PWM) signal that results from the ramp signal crossing the compensation level during the ramping.

In some embodiments, the method can further include configuring the PWM circuit to a second mode upon determining that the low duty cycle output voltage is not desired. The second mode can include the ramping beginning substantially with the second edge of the clock signal instead of before the second edge.

In accordance with some implementations, the present disclosure relates to a system for generating a low duty cycle output voltage. The system includes a ramping circuit configured to generate a ramp signal having a voltage that crosses a compensation level in a first crossing when the ramp signal is set to a first level based on a first edge of a clock signal, and in a second crossing when the ramp signal is being ramped away from the first level. The system further includes a pulse-width modulation (PWM) circuit configured to generate a PWM pulse such that the PWM pulse starts based on the first crossing and ends based on the second crossing. The system further includes an output circuit configured to generate an output pulse such that the output pulse starts based on a second edge of the clock signal and ends based on the end of the PWM pulse. The system further includes a control component configured to initiate ramping of the ramp signal before the second edge of the clock.

In some embodiments, the first level of the ramp signal can be a low state and the second level of the ramp signal can be a high state, such that the ramp signal increases as it is ramped away from the first level. The ramp signal can be set to the low state substantially with the first edge of the clock signal. The first edge of the clock signal can be a rising edge of the clock signal. The PWM pulse can start after a first delay from the time of the first crossing. The PWM pulse can end after a second delay from the time of the second crossing. Each of the first delay and the second delay can include a delay associated with the PWM circuit. The delay associated with the PWM circuit can include a delay associated with a comparator that compares the compensation level and the voltage level of the ramp signal.

In some embodiments, the output pulse can start substantially with the second edge of the clock signal. The output pulse can end substantially with the end of the PWM pulse. The ramping of the ramp signal initiating before the second edge of the clock can allow the output pulse to have a width that is less than the lesser of the first delay and the second delay.

In some embodiments, the system can further include a control loop configured to maintain the compensation level at a desired level based on the output pulse. In some embodiments, the control component can be configured to initiate the ramping of the ramp signal in response to an external control signal. In some embodiments, the control component can be configured to generate a control signal to initiate the ramping of the ramp signal.

In some implementations, the present disclosure relates to a switching regulator that includes a substrate and a ramping circuit implemented on the substrate. The ramping circuit is configured to generate a ramp signal having a voltage that crosses a compensation level in a first crossing when the ramp signal is set to a first level based on a first edge of a clock signal, and in a second crossing when the ramp signal is being ramped away from the first level. The switching regulator further includes a pulse-width modulation (PWM) circuit implemented on the substrate. The PWM circuit is configured to generate a PWM pulse such that the PWM pulse starts based on the first crossing and ends based on the second crossing. The switching regulator further includes an output circuit implemented on the substrate. The output circuit is configured to generate an output pulse such that the output pulse starts based on a second edge of the clock signal and ends based on the end of the PWM pulse. The switching regulator further includes a control component implemented on the substrate. The control component is configured to initiate ramping of the ramp signal before the second edge of the clock.

According to some implementations, the present disclosure relates to a power management integrated circuit (PMIC) module that includes a packaging substrate configured to receive a plurality of components, and a switching regulator implemented on the packaging substrate. The switching regulator includes a ramping circuit configured to generate a ramp signal having a voltage that crosses a compensation level in a first crossing when the ramp signal is set to a first level based on a first edge of a clock signal, and in a second crossing when the ramp signal is being ramped away from the first level. The switching regulator further includes a pulse-width modulation (PWM) circuit configured to generate a PWM pulse such that the PWM pulse starts based on the first crossing and ends based on the second crossing. The switching regulator further includes an output circuit configured to generate an output pulse such that the output pulse starts based on a second edge of the clock signal and ends based on the end of the PWM pulse. The switching regulator is configured to initiate ramping of the ramp signal before the second edge of the clock.

In a number of implementations, the present disclosure relates to a wireless device having a transceiver configured to process RF signals, and an antenna in communication with the transceiver. The antenna is configured to facilitate transmission and receiving of respective RF signals. The wireless device further includes a switching regulator configured to regulate a voltage signal that facilitates the transmission and receiving of the RF signals. The switching regulator includes a ramping circuit configured to generate a ramp signal having a voltage that crosses a compensation level in a first crossing when the ramp signal is set to a first level based on a first edge of a clock signal, and in a second crossing when the ramp signal is being ramped away from the first level. The switching regulator further includes a pulse-width modulation (PWM) circuit configured to generate a PWM pulse such that the PWM pulse starts based on the first crossing and ends based on the second crossing. The switching regulator further includes an output circuit configured to generate an output pulse such that the output pulse starts based on a second edge of the clock signal and ends based on the end of the PWM pulse. The switching regulator is configured to initiate ramping of the ramp signal before the second edge of the clock.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 6 shows an expanded view of a portion of the timing configuration of FIG. 5.

FIG. 7 shows a variation to the example of FIGS. 5 and 6, where a difference (ΔV) between a COMP level and the bottom of a RAMP signal can be reduced.

FIG. 8 shows a process that can be implemented to generate a small duty cycle where an output signal can have a width that is smaller than a minimum width associated with, for example, a delay of a comparator.

FIG. 9 shows a process that can be implemented as a more specific example of the process of FIG. 8.

DETAILED DESCRIPTION OF SOME EMBODIMENTS

The headings provided herein, if any, are for convenience only and do not necessarily affect the scope or meaning of the claimed invention.

Disclosed are non-limiting examples of systems, devices, circuits and/or methods related to techniques for achieving small duty cycles in a controlled manner. Such techniques can be implemented in, for example, switching regulators. Although described in the context of switching regulators, it will be understood that one or more features of the present disclosure can also be utilized in other applications.

In many switching regulator applications, it can be desirable to be able to maintain voltage regulation while holding a steady-state duty cycle that is very low. However, such a configuration can encounter instability, especially at high switching frequencies. Instability in the inductor current waveform typically results in instability and excessive ripple in the output voltage which is often undesirable.

In an example of a switching regulator application, a fixed-frequency pulse-width modulation (PWM) voltage-mode topology can be configured such that an internally generated voltage ramp is compared to a voltage generated by an error amplifier. As the name implies, the error amplifier can be configured to amplify an error between an internal reference and an external output voltage that is being regulated. In a step-down regulator that utilizes leading-edge PWM modulation, a high input voltage and a low output voltage typically requires a low duty cycle. To achieve such a low duty cycle, the voltage ramp typically crosses the error amplifier output almost immediately after the cycle starts.

Described herein are examples of how extremely small duty cycles can be achieved PWM applications, such as in switch mode power supplies that use a PWM comparator. Although described in the example context of a voltage mode PWM step-down converter, it will be understood that one or more features of the present disclosure can also be utilized in other types of PWM applications.

Figure 1:
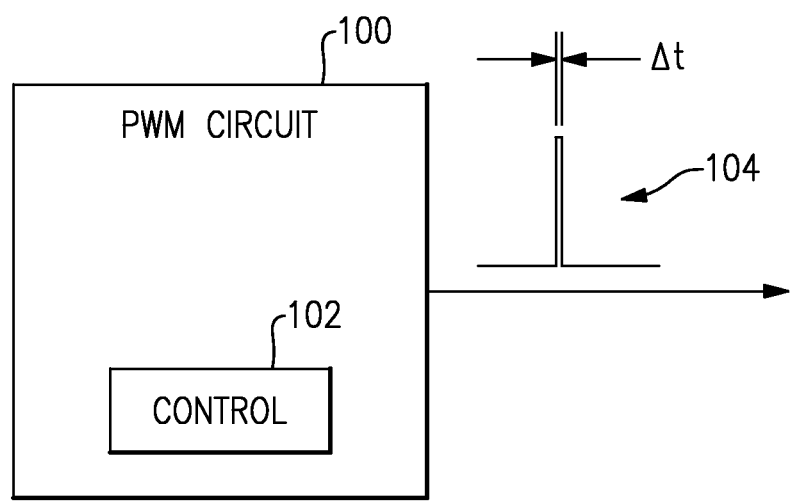
FIG. 1 shows a block diagram of a pulse-width modulation (PWM) circuit having a control component.

FIG. 1 shows a block diagram of a PWM circuit 100 having a control component 102. The PWM circuit 100 is shown to generate an output signal having a pulse 104 with a width Δt. As described herein, the pulse width Δt can be made to be relatively small to allow, for example, implementation of extremely small duty cycles. In some embodiments, such a small pulse 104 can be generated at least in part by, and/or facilitated by, the control component 102.

Figure 2:
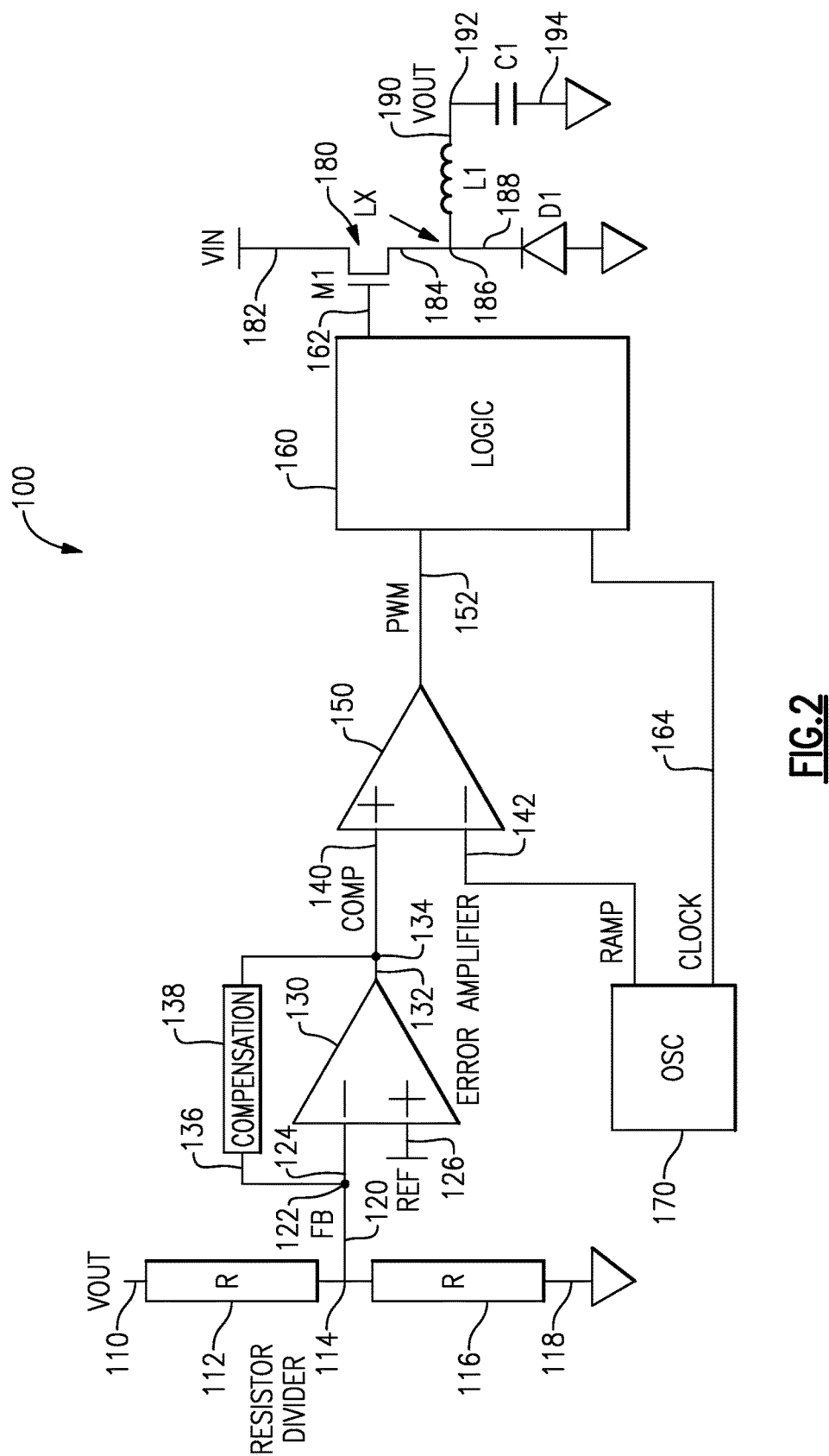
FIG. 2 shows a diagram of a step-down PWM converter that can be configured to provide small duty cycles.

FIG. 2 shows a diagram of a step-down PWM converter 100 that can be configured to provide small duty cycles. The example step-down PWM converter 100 is shown to generate an output voltage VOUT at node 192 which can be regulated by a loop as described herein. The output voltage VOUT can be provided to a resistive divider (e.g., a resistor divider) from the output node 192 through path 110.

The resistor divider can include a first resistance 112 and a second resistance 116 connected in series through node 114. The second resistance 116 can be coupled to a ground so as to form the resistor divider circuit. The first and second resistance values may or may not be the same. Configured in such an example manner, the VOUT voltage can be divided down by the resistor divider to produce a proportionally smaller feedback voltage FB at node 114.

The feedback voltage FB is shown to be provided to an error amplifier 130 which can include a differential op-amp. For example, the feedback voltage FB is shown to be provided to an inverting input of the error amplifier 130 from node 114, through path 120, node 122, and path 124. A non-inverting input of the error amplifier 130 is shown to be provided with an internal reference voltage REF through path 126. The difference between the feedback voltage FB and the internal reference voltage REF is shown to be amplified by the error amplifier 130 to produce a compensation voltage COMP as an output (132). If the feedback voltage FB is too high (e.g., relative to the internal reference voltage REF), the compensation voltage COMP can be decreased toward a desired level. If the feedback voltage FB is too low (e.g., relative to the internal reference voltage REF), the compensation voltage COMP can be increased toward the desired level.

A feedback loop can be provided, for example, from the output 132 of the error amplifier 130, through node 134, a compensation adjustment circuit 138 along a feedback path 136, node 122, and the inverting input (124). The compensation adjustment circuit 138 can be configured to allow adjustment of the desired level of the compensation voltage COMP.

The example step-down PWM converter 100 is shown to further include a comparator 150 which receives the compensation voltage COMP as a non-inverting input 140 and a ramp signal (RAMP) (e.g., a triangular ramp signal) as an inverting input 142. The RAMP signal is shown to be provided by an oscillator (OSC) 170. The oscillator 170 is shown to also generate a clock signal (CLOCK) which is provided to a logic circuit 160 through path 164. Examples of how the RAMP signal can be generated relative the CLOCK signal are described herein in greater detail.

The compensation voltage COMP can be compared to the RAMP signal by the comparator 150. When COMP is above RAMP, the comparator 150 can produce, at an output path 152, a PWM signal having a logic high state. When COMP is below RAMP, the PWM signal can have a logic low state.

The PWM signal and the CLOCK signal are shown to be provided to the logic circuit 160. The logic circuit 160 is shown to generate a switching signal through path 162 to a switch (M1) 180. When the switch (M1) 180 is in an ON state, the LX node 186 can be connected to an input voltage VIN through path 182, the switch M1, and path 184. Accordingly, transfer of power from VIN to the LX node 186 can occur when the switch M1 is ON.

The LX node 186 is shown to be coupled to the VOUT node 192 through an inductance L1 along a path 190. Such an inductance can be provided by an inductor, by some or all of the path 190, or some combination thereof. The inductance L1 can be configured to build up energy as it charges the output to yield VOUT.

In some embodiments, the PWM signal going low from high can terminate the transfer of power by turning the switch M1 OFF. Accordingly, the LX node can drop and a diode D1 can discharge the inductance L1 through path 188. The percentage of time that power is being transferred during a given cycle (e.g., from one clock to the next) is commonly referred to as the duty cycle of the PWM converter 100.

Figure 3:
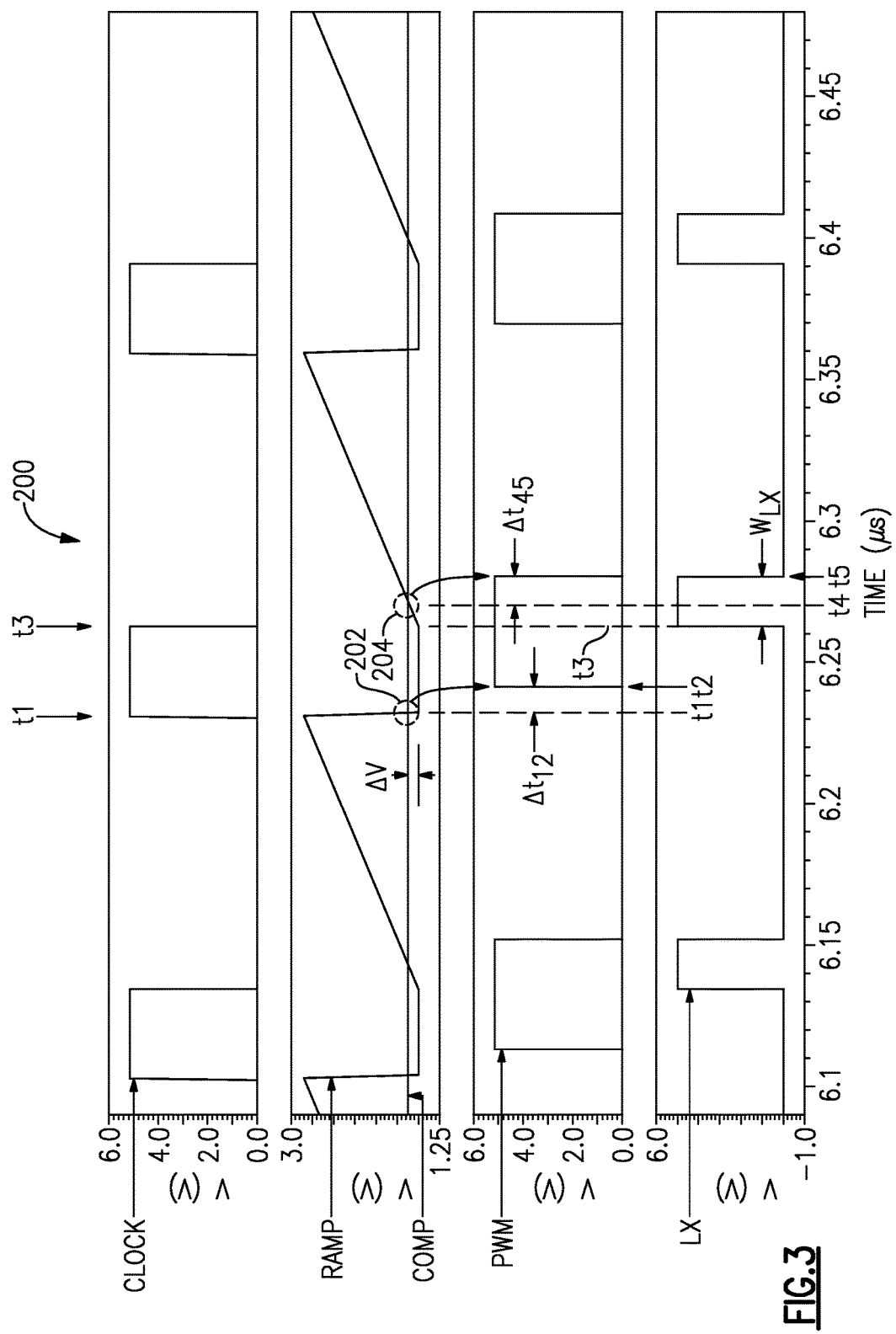
FIG. 3 shows an example timing configuration that can be implemented in the example PWM converter of FIG. 2.

FIG. 3 shows an example timing configuration 200 that can be implemented in the example PWM converter 100 of FIG. 2. At time t1, the CLOCK signal is shown to go high, which results in the RAMP signal to drop to a low level below the COMP level. In FIG. 3, the difference between the low level of the RAMP signal and the COMP level is indicated as ΔV.

During the foregoing drop of the RAMP signal, the RAMP level crosses the COMP level (e.g., at 202), thereby inducing a transition in the PWM signal output from the comparator 150 of FIG. 2. However, there is typically a propagation delay in the comparator 150 which introduces a delay between when the RAMP signal crosses the COMP level (e.g., 202, at approximately time t1) and when the PWM signal switches state (e.g., from low to high at approximately time t2). In the example of FIG. 3, such a delay between times t2 and t1 is indicated as $\Delta t_{12}$.

At time t3, the CLOCK signal is shown to go low, which results in the RAMP signal to begin ramping up. The CLOCK signal going low is also shown to result in the LX signal to go high at approximately t3, thereby beginning power transfer (e.g., from VIN to the LX node 186 in FIG. 2). The LX signal is shown to go low at approximately t5, resulting from the PWM signal going low, also at approximately t5.

The foregoing high-to-low transition of the PWM signal is shown to result from the ramping RAMP signal crossing the COMP level (e.g., at 204). As with the propagation delay in the comparator 150 resulting in the time delay $\Delta t_{12}$ between the crossing 202 time (approximately t1) and the low-to-high transition of the PWM signal (approximately t2), there is typically a delay between time t4 of the crossing 204 and the high-to-low transition of the PWM signal (approximately t5). In the example of FIG. 3, such a delay between times t5 and t4 is indicated as $\Delta t_{45}$.

In the example of FIG. 3, one can see that the width of the LX signal ($W_{LX}$) is generally the duration between t3 and t4 of the crossing 204, plus the delay $\Delta t_{45}$. Accordingly, the minimum width of the LX signal is generally limited by the delay $\Delta t_{45}$, which in turn forms a lower limit of the duty cycle of the PWM converter 100 of FIG. 2 when operated in the example configuration 200 of FIG. 3. Although the delay $\Delta t_{45}$ is described in the context of the propagation delay of the PWM comparator 150, there may be delays contributed by other circuits in the PWM converter 100. For example, there may be delays resulting from various switching operation.

In the example of FIG. 3, both of the ramp-up and LX signals are started by the falling edge of the CLOCK signal, thereby resulting in the minimum width of the LX signal including the propagation delay of the PWM comparator 150. In a steady state, if the minimum width of the LX signal is so large that too much power is being transferred in every cycle, then a regulator can be forced the skip cycles. This will typically produce an unstable and irregular steady state LX power waveform.

The foregoing effect can be problematic in a step-down regulator when a very low ratio between the output and the input is desired. Such a ratio between the output and the input represents a steady state duty cycle that should be seen on the LX pin. For example, if it is desired to have the output voltage regulated to 0.5 V and the input voltage is at 5 V, then the duty cycle is preferably 10%. If the switching regulator has a clock that is operating at 6 MHz and has a period of 167 ns, then the width of the LX signal is preferably approximately 16.7 ns (10% of 167 ns). If the comparator propagation delay is already larger than 16.7 ns, then the LX signal will be larger and thus the output voltage may overcharge. If the regulator is set up to skip cycles, then after overcharging, the regulator will need to skip one or more cycles to compensate for the overcharging.

Figure 4:
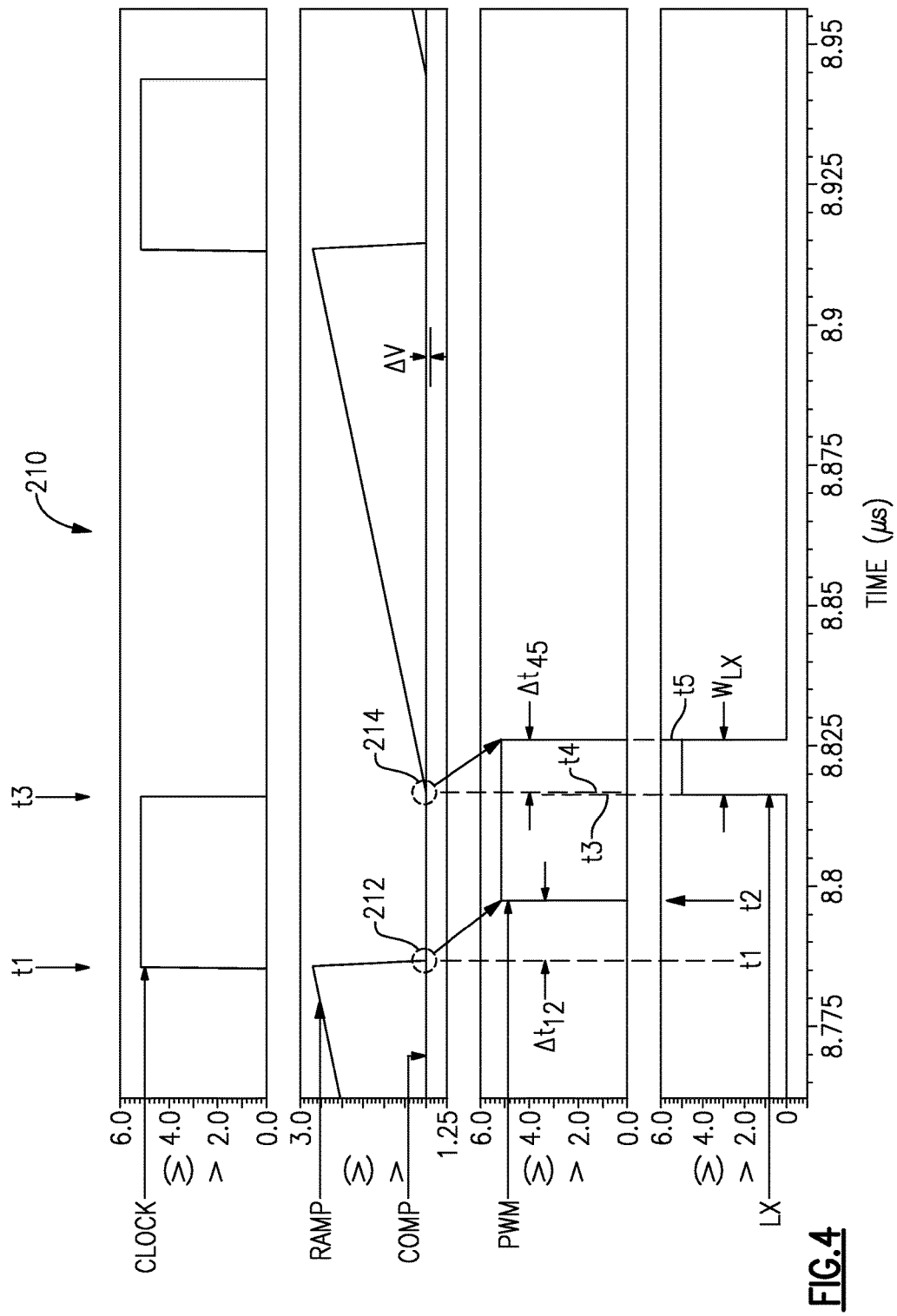
FIG. 4 shows an example timing configuration where a voltage difference ΔV between a COMP level and the bottom of a RAMP signal can be reduced to reduce the width of an output signal.

As shown in FIG. 3, the time duration between t3 (when the RAMP signal begins ramping up triggered by the CLOCK signal going low) and the crossing time t4 can depend on the ramp rate and/or on ΔV. FIG. 4 shows an example timing configuration 210 where the voltage difference ΔV between the COMP level and the bottom of the RAMP signal is reduced to reduce the width of the LX signal ($W_{LX}$). Other than the reduced value of ΔV, the timing configuration 210 can be similar to the example of FIG. 3, including the time indicators t1-t5 and the corresponding crossings 212, 214.

In this example, the COMP level is barely at the bottom of the RAMP signal; and accordingly, the crossing 214 occurs immediately or nearly immediately after the ramping starts for the RAMP signal by the fall of the CLOCK signal. The corresponding time duration between t3 and t4 can be approximately or close to zero. Accordingly, the propagation delay $\Delta t_{45}$ essentially forms the entire width of the LX signal ($W_{LX}$).

It is noted that because of the reduced value of ΔV, the COMP level can become lower than the bottom of the RAMP signal. In such a situation, an entire cycle can be skipped yielding no output. Thus, the timing configurations 200, 210 of FIGS. 3 and 4 generally cannot produce LX signal widths ($W_{LX}$) between zero and the minimum width corresponding to the propagation delay $\Delta t_{45}$.

Figure 5:
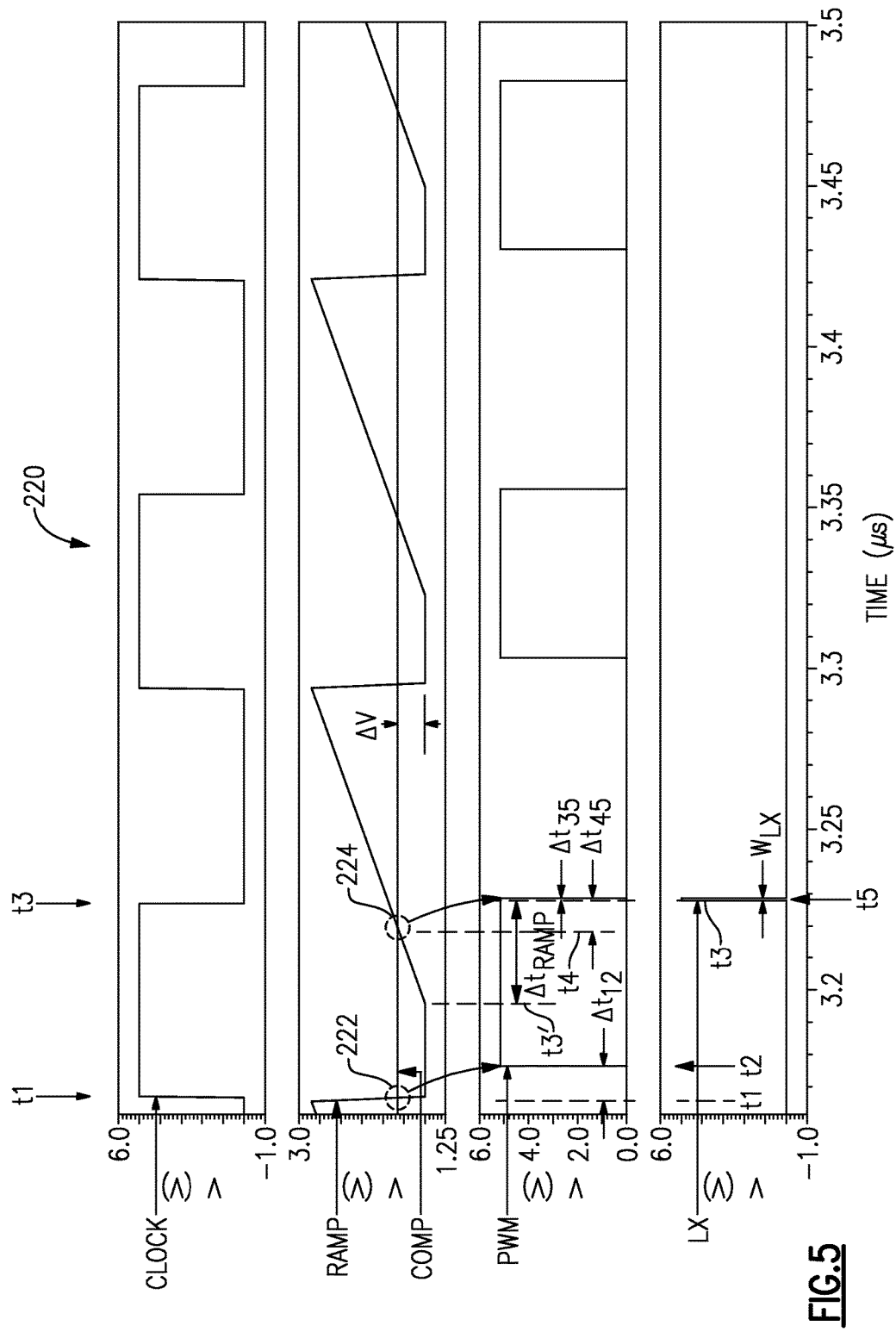
FIG. 5 shows an example timing configuration where ramping up of a RAMP signal can begin at a time different from the fall of a CLOCK signal.

FIG. 5 shows an example timing configuration 220 where ramping up of a RAMP signal can begin at a time different from the fall of a CLOCK signal. FIG. 6 shows an expanded view of a portion of the timing configuration 220 of FIG. 5 for clarification. FIG. 7 shows a variation to the example of FIGS. 5 and 6, where the difference (ΔV) between a COMP level and the bottom of a RAMP signal is reduced.

As in the examples of FIGS. 3 and 4, the CLOCK signal goes high at time t1, and goes low at time t3. Also as in the examples of FIGS. 3 and 4, the RAMP signal can fall to its bottom level when the CLOCK signal goes high at time t1. During such a fall, the RAMP signal crosses the COMP level at a crossing 222 to thereby induce a flip in the PWM output of the comparator (150 in FIG. 2). Accordingly, the PWM signal is shown to go high at time t2 after a delay of $\Delta t_{12}$ that includes a propagation delay associated with the comparator 150.

In the examples of FIGS. 3 and 4, the ramping up of the RAMP signal occurs at approximately t3 when the CLOCK signal goes low. In the example of FIGS. 5 and 6, the ramping up of the RAMP signal can occur at time t3' which is offset from t3 by an amount of $\Delta t_{RAMP}$=t3−t3'. Such a ramp-up of the RAMP signal can yield a crossing 224 at time t4 which induces a flip in the PWM signal. Accordingly, the PWM signal is shown to go low at time t5 after a delay of $\Delta t_{45}$ that includes a propagation delay associated with the comparator 150.

In the example of FIGS. 5 and 6, an LX signal is shown to go high when the CLOCK signal goes low at time t3, and go low when the PWM signal goes low, similar to the examples of FIGS. 3 and 4. However, because the start of ramp-up (at t3' in FIG. 5) is not tied to the fall of the CLOCK signal at t3 as in the examples of FIGS. 3 and 4, width of the LX signal ($W_{LX}$) in FIGS. 5 and 6 can be smaller than the delay duration $\Delta t_{45}$. For example, the amount of offset $\Delta t_{RAMP}$ between t3 and t3' can be selected so that the delayed fall of the PWM signal at t5 is after t3 (when LX goes high) by a selected amount ($\Delta t_{35}$) that is less than the delay duration $\Delta t_{45}$. Accordingly, the width of the LX signal ($W_{LX}$) in FIGS. 5 and 6 can be approximately equal to such a selected duration amount ($\Delta t_{35}$).

In an example timing configuration 230 of FIG. 7, the voltage difference (ΔV) between the COMP level and the bottom of the RAMP signal is reduced when compared to the example of FIG. 6. Accordingly, the beginning time (t3') of ramp-up of the RAMP signal is closer to t4 corresponding to the crossing 234, when compared to the example of FIG. 6. However, because of the offset $\Delta t_{RAMP}$ between t3 when the CLOCK signal goes low and t3' when the ramp-up begins, the resulting width of the LX signal ($W_{LX}$) is generally not impacted by the change in ΔV. Accordingly, one can see that an appropriate offset $\Delta t_{RAMP}$ can desirably allow the LX signal width $W_{LX}$ to be generally insensitive to ΔV.

FIG. 8 shows a process 300 that can be implemented to generate a small duty cycle where an output LX signal has a width that is smaller than a minimum width associated with, for example, a delay of a comparator. In block 302, a ramp signal (RAMP) can be made to transition to a first level from a second level with a first edge of a clock pulse (CLOCK). In block 304, a PWN signal can be made to transition from a first level to a second level upon a first delay resulting from the ramp signal crossing a compensation level (COMP). In block 306, transition of the ramp signal can be initiated, from the first level towards the second level, at a time before a second edge of the clock pulse. In block 308, an output signal (LX) can be made to transition from a first level to a second level with the second edge of the clock pulse. In block 310, the output signal (LX) can be made to transition from the second level to the first level upon a second delay resulting from the ramp signal crossing the compensation level.

In the example process 300 of FIG. 8, transitions of the various signals are described in the context of first and second levels, as well as first and second edges. Among others, FIG. 8 shows that the various examples described in reference to FIGS. 3-7 are examples where low and high logic levels, or high and low logic levels, can be examples of more general first and second levels. Similarly, rising and falling edges, or falling and rising edges, can be examples of more general first and second edges. Accordingly, it will be understood that one or more features of the present disclosure can also be implemented in configurations that are different from the more specific examples described herein.

FIG. 9 shows a process 320 that can be implemented as a more specific example of the process 300 of FIG. 8, in the more specific example context of FIGS. 5-7. In block 322, a ramp signal (RAMP) can be made to transition to a low level with a rising edge of a clock pulse (CLOCK). In block 324, a PWM signal can be made to transition from a high level to a low level upon a first delay resulting from the ramp signal crossing a compensation level (COMP). In block 326, the ramp signal can be made to begin its increase from the low level towards the high level at a time before a falling edge of the clock pulse. In block 328, an output signal (LX) can be made to transition from a low level to a high level with the falling edge of the clock pulse. In block 330, the output signal can be made to transition from the high level to the low level upon a second delay resulting from the ramp signal crossing the compensation level.

As described herein, a RAMP signal having its ramp-up started before the falling edge of a CLOCK signal can yield a configuration where a propagation delay (e.g., a comparator propagation delay) ceases to become an issue when defining a minimum duty cycle. In some embodiments, such a configuration of ramping up before the falling edge of the CLOCK signal can be implemented at all operating conditions, or partially under selected conditions. For example, it may not be desirable to implement the foregoing ramping up of the RAMP signal before the falling edge of the CLOCK signal if delaying of the CLOCK's falling edge limits the maximum cycle.

In some embodiments, the foregoing delayed fall of the CLOCK signal to allow the ramping to occur before the fall can be implemented if the duty cycle needs to be lower than a selected value. For example, two operating conditions can be defined as a low steady-state duty cycle condition and a high steady-state duty cycle condition. When the high steady-state duty cycle condition is detected (e.g., by a comparator to compare the output and input voltages), the CLOCK's falling edge can be un-delayed such that the ramping begins at the falling edge of the CLOCK signal (e.g., FIG. 3). When the low steady-state duty cycle condition is detected (e.g., by the comparator to compare the output and input voltages), the CLOCK's falling edge can be delayed such that the ramping begins before the falling edge of the CLOCK signal (e.g., FIG. 5).

Figure 10:
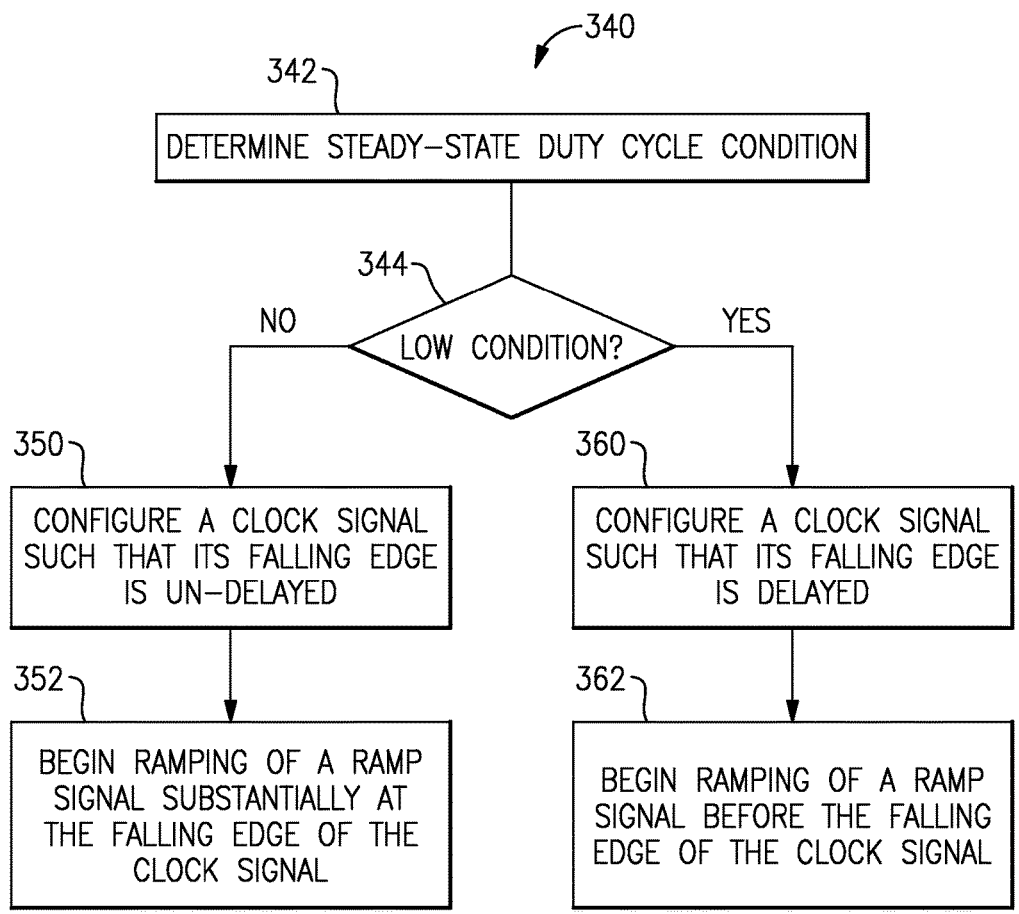
FIG. 10 shows a process that can be implemented to selectively utilize generation of the small duty cycle output signal.

FIG. 10 shows a process 340 that can be implemented to selectively utilize the foregoing delaying and un-delaying of the CLOCK's falling edge to allow the ramp-up to begin before or with the falling edge. In block 342, steady-state duty cycle condition can be determined. In a decision block 344, the process 340 can determine whether a low steady-state duty cycle condition exists. If the answer is No, the process 340 can configured a CLOCK signal such that its falling edge is un-delayed in block 350. In block 352, ramping of a RAMP signal can begin substantially at the falling edge of the CLOCK signal. If the answer is Yes, the process 340 can configured a CLOCK signal such that its falling edge is delayed in block 360. In block 362, ramping of a RAMP signal can begin before the falling edge of the CLOCK signal.

In the foregoing example of operating a PWM circuit with and without the delay of falling edge of CLOCK signals, one or more switching operations may be involved to transition between the two configurations. In such a situation, a glitch may occur because some time is typically needed for the COMP level to adjust to a new level to maintain a desired duty cycle. To minimize or reduce such a glitch, the RAMP signal can be level-shifted to minimize or reduce the change the COMP would need to experience.

As described herein, a switch mode regulator having one or more features of the present disclosure can include an ability to regulate at extremely small duty cycles. Such a capability can allow the switch regulator to operate at very high switching frequencies; and at such frequencies, a smaller inductor can be utilized, thereby providing advantages such as lower cost, a smaller output ripple and a faster transient response.

Figure 11:
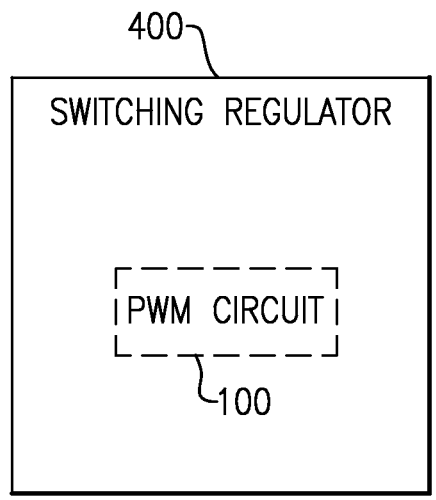
FIG. 11 shows that in some embodiments, a PWM circuit having one or more features as described herein can be implemented in a switching regulator.

FIG. 11 shows that in some embodiments, a PWM circuit 100 having one or more features as described herein can be implemented in a switching regulator 400. Such a switching regulator can include, for example, a voltage mode switching regulator which uses a ramp signal to generate at least a portion of a PWM signal. Such a switching regulator can include, for example, a buck regulator, a boost regulator, a buck-boost regulator, etc.

Figure 12:
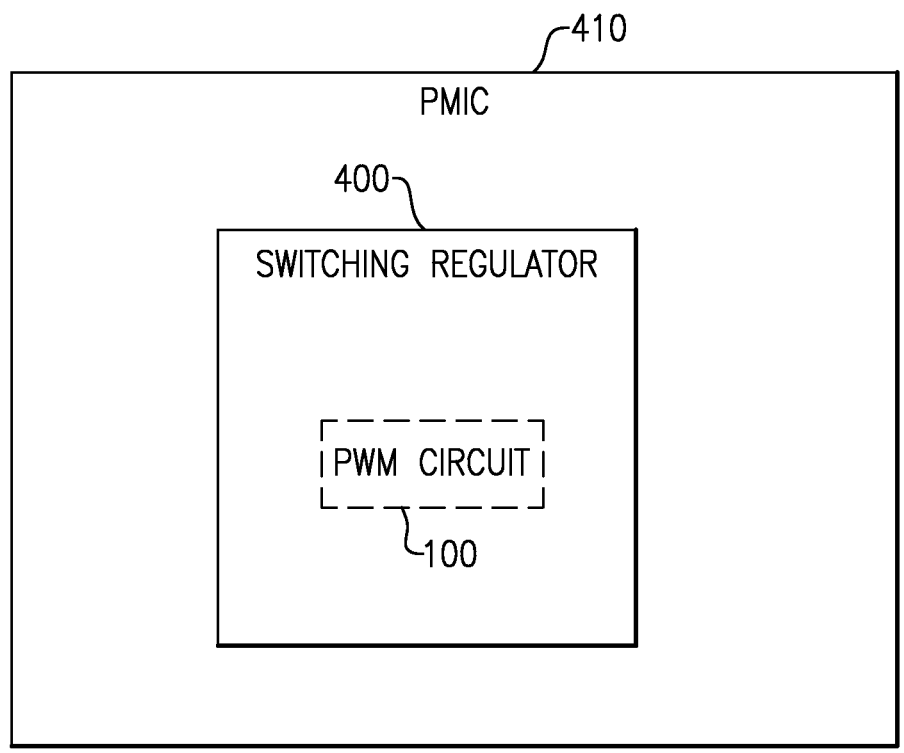
FIG. 12 depicts a power management integrated circuit (PMIC) that includes a switching regulator having one or more features as described herein.

The switching regulator 400 can be implemented as a standalone discrete device, as part of an integrated circuit (IC) device or system such as a power management integrated circuit (PMIC), and/or any combination thereof. FIG. 12 depicts a PMIC 410 that includes a switching regulator 400. The switching regulator 400 is shown to include a PWM circuit 100 having one or more features as described herein.

In some embodiments, the PMIC 410 of FIG. 12 can be implemented on a single chip, and can include one or more switching regulators and one or more linear regulators. In some embodiments, such a PMIC can be configured to be used in devices including, for example, wireless devices such as cellular phones, or any devices that utilize switching regulators.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
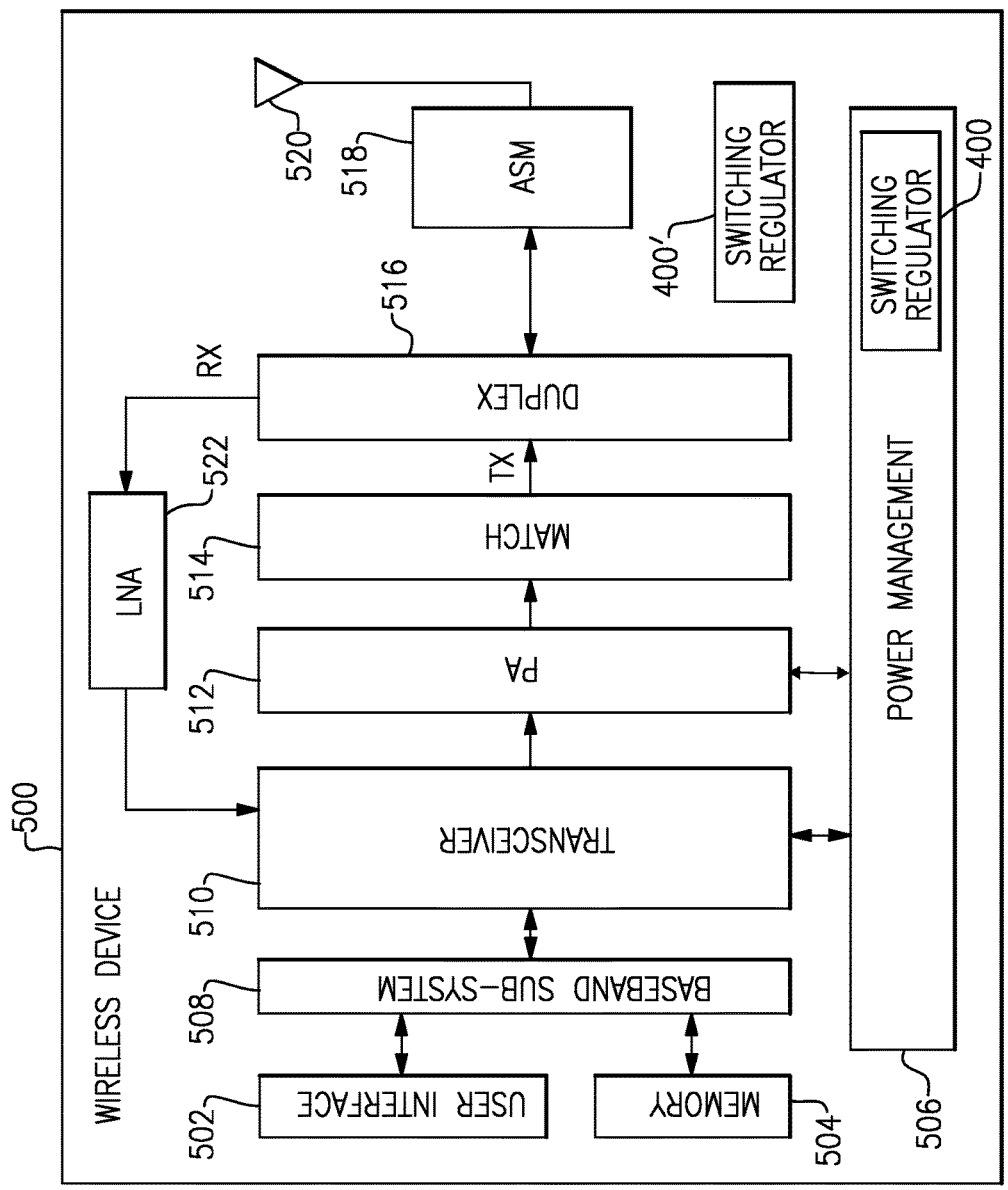
FIG. 13 shows that in some embodiments, one or more features of the present disclosure can be implemented in an electronic device such as a wireless device.

FIG. 13 depicts an example wireless device 500 having one or more advantageous features described herein. In some embodiments, a transceiver 510 can be configured and operated to generate RF signals to be amplified and transmitted, and to process received signals. One or more power amplifiers (PAs) 512 can receive their respective RF signals from the transceiver 510 and amplify such RF signals for transmission. The amplified outputs of the PAs 512 are shown to be matched (via one or more matching circuits 514) and routed to an antenna 520 via their respective duplexer(s) 516 and an antenna switch module (ASM) 518. In some embodiments, some or all of the PAs 512 can be connected to a power management component 506 configured to provide, for example, supply voltages and/or bias signals to the PAs 512.

In some embodiments, the duplexer(s) 516 can allow transmit and receive operations to be performed simultaneously using a common antenna (e.g., 520). In FIG. 13, received signals are shown to be routed to one or more "RX" paths that can include, for example, one or more low-noise amplifiers (LNAs) 522. Received signals amplified by the LNA(s) 522 are shown to be routed to the transceiver 510 for further processing.

In FIG. 13, the transceiver 510 is shown to interact with a baseband sub-system 508 that is configured to provide conversion between data and/or voice signals suitable for a user and RF signals suitable for the transceiver 510. The transceiver 510 is also shown to be connected to the power management component 506 that is configured to manage power for the operation of the wireless device.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example of FIG. 13, the power management component 506 can be implemented as a PMIC that includes a switching regulator 400 having one or more features as described herein. In some embodiments, a switching regulator 400' can also be implemented as a standalone device outside of the PMIC.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for generating a low duty cycle output voltage, the method comprising:
    setting a ramp signal to a first level substantially with a first edge of a clock signal;
    adjusting a compensation level using a compensation feedback circuit;
    determining a steady state duty cycle condition; and
    in accordance with a determination that the steady state duty cycle condition is low:
        delaying a second edge of the clock signal; and
        ramping the ramp signal from the first level towards a second level such that voltage level of the ramp signal crosses the compensation level, the ramping beginning at a time before the delayed second edge of the clock signal;
    in accordance with a determination that the steady state duty cycle condition is high:
        ramping the ramp signal from the first level towards the second level such that voltage level of the ramp signal crosses the compensation level, the ramping beginning substantially at a time of occurrence of the second edge of the clock signal;
    starting an output pulse substantially with the second edge of the clock signal; and
    ending the output pulse substantially with an edge of a pulse-width modulation (PWM) signal that results from the ramp signal crossing the compensation level during the ramping.

2. The method of claim 1 wherein the first edge and the second edge of the clock signal are a rising edge and a falling edge, respectively.

3. The method of claim 2 wherein the first level of the ramp signal includes a low voltage level that is lower than the compensation level.

4. The method of claim 3 wherein the second level of the ramp signal includes a high voltage level that is higher than the compensation level.

5. The method of claim 4 wherein the ramping of the ramp signal includes a monotonic increase in the voltage level of the ramp signal.

6. The method of claim 5 wherein the monotonically increasing voltage level includes a level-shifted profile.

7. The method of claim 4 wherein the edge of the PWM signal that ends the output pulse is a falling edge of the PWM signal.

8. The method of claim 7 wherein the PWM signal includes a rising edge prior to its falling edge, the rising edge of the PWM signal resulting from a crossing of the ramp signal voltage level and the compensation level when the ramp signal is set to the low voltage level with the rising edge of the clock signal.

9. The method of claim 8 wherein the rising edge of the PWM signal is delayed from the crossing of the ramp signal voltage level and the compensation level when the ramp signal is set to the low voltage level.

10. The method of claim 8 wherein the falling edge of the PWM signal is delayed from the crossing of the ramp signal voltage level and the compensation level during the ramping.

11. The method of claim 10 wherein the beginning time of the ramping is selected such that the width of the output pulse is less than the delay between the falling edge of the PWM signal and the crossing during the ramping.

12. The method of claim 11 wherein the width of the output pulse is selected to yield a low duty cycle output voltage that is less than a duty cycle output voltage associated with an output pulse having a width substantially the same as the delay between the falling edge of the PWM signal and the crossing during the ramping.

13. The method of claim 1 wherein the output pulse is generated by switching on and off of an input voltage.

14. The method of claim 13 wherein the switching on and off of the input voltage correspond to the starting and ending of the output pulse, respectively.

15. The method of claim 13 further comprising providing the output pulse in a feedback loop to regulate the compensation level.

16. The method of claim 15 wherein the feedback loop includes a voltage divider configured to yield a reduced feedback voltage corresponding to the output pulse.

17. The method of claim 16 wherein the feedback loop further includes an error amplifier configured to amplify a difference between the feedback voltage and a reference voltage and yield as an output the compensation level.

18. The method of claim 17 wherein the error amplifier includes the compensation feedback circuit configured to allow adjustment of the compensation level.

19. A switching regulator comprising:
a substrate;
a compensation feedback circuit configured to allow adjustment of a compensation level;
a ramping circuit implemented on the substrate, the ramping circuit configured to generate a ramp signal having a voltage that crosses the compensation level in a first crossing when the ramp signal is set to a first level based on a first edge of a clock signal, and in a second crossing when the ramp signal is being ramped away from the first level;
a pulse-width modulation (PWM) circuit implemented on the substrate, the PWM circuit configured to generate a PWM pulse such that the PWM pulse starts based on the first crossing and ends based on the second crossing;
an output circuit implemented on the substrate, the output circuit configured to generate an output pulse such that the output pulse starts based on a second edge of the clock signal and ends based on the end of the PWM pulse; and
a control component implemented on the substrate, the control component configured to initiate ramping of the ramp signal before the second edge of the clock in accordance with a determination that a steady state duty cycle condition is low by delaying the second edge of the clock signal.

20. A power management integrated circuit (PMIC) module comprising:
a packaging substrate configured to receive a plurality of components; and
a switching regulator implemented on the packaging substrate, the switching regulator including a compensation feedback circuit configured to allow adjustment of a compensation level, the switching regulator further including a ramping circuit configured to generate a ramp signal having a voltage that crosses the compensation level in a first crossing when the ramp signal is set to a first level based on a first edge of a clock signal, and in a second crossing when the ramp signal is being ramped away from the first level, the switching regulator further including a pulse-width modulation (PWM) circuit configured to generate a PWM pulse such that the PWM pulse starts based on the first crossing and ends based on the second crossing, the switching regulator further including an output circuit configured to generate an output pulse such that the output pulse starts based on a second edge of the clock signal and ends based on the end of the PWM pulse, the switching regulator further including a control component configured to initiate ramping of the ramp signal before the second edge of the clock in accordance with a determination that a steady state duty cycle condition is low by delaying the second edge of the clock signal.

* * * * *